(12) United States Patent
Liu et al.

(10) Patent No.: US 10,489,628 B2
(45) Date of Patent: Nov. 26, 2019

(54) FINGERPRINT RECOGNITION DEVICE, METHOD FOR FABRICATING THE SAME AND DISPLAY DEVICE

(71) Applicant: BOE TECHNOLOGY GROUP CO., LTD., Beijing (CN)

(72) Inventors: Yingming Liu, Beijing (CN); Xue Dong, Beijing (CN); Jing Lv, Beijing (CN); Haisheng Wang, Beijing (CN); Chunwei Wu, Beijing (CN); Xiaoliang Ding, Beijing (CN); Feng Liao, Beijing (CN); Qingrong Ren, Beijing (CN); Rui Xu, Beijing (CN); Changfeng Li, Beijing (CA); Yanan Jia, Beijing (CN); Lijun Zhao, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 15/570,166

(22) PCT Filed: May 12, 2017

(86) PCT No.: PCT/CN2017/084051
§ 371 (c)(1),
(2) Date: Oct. 27, 2017

(87) PCT Pub. No.: WO2018/018996
PCT Pub. Date: Feb. 1, 2018

(65) Prior Publication Data
US 2018/0285617 A1    Oct. 4, 2018

(30) Foreign Application Priority Data
Jul. 26, 2016    (CN) .......................... 2016 1 0595758

(51) Int. Cl.
*G06K 9/00* (2006.01)
*H01L 21/84* (2006.01)
(Continued)

(52) U.S. Cl.
CPC ............ *G06K 9/0004* (2013.01); *H01L 21/84* (2013.01); *H01L 27/12* (2013.01);
(Continued)

(58) Field of Classification Search
CPC ....... G06K 9/0004; H01L 21/84; H01L 27/12; H01L 27/14623; H01L 27/14636;
(Continued)

(56) References Cited

U.S. PATENT DOCUMENTS 5,619,033 A * 4/1997 Weisfield .......... H01L 27/14643
250/208.1
2003/0183019 A1    10/2003 Chae
(Continued)

FOREIGN PATENT DOCUMENTS

CN    102403311 A    4/2012
CN    102790096 A    11/2012
(Continued)

OTHER PUBLICATIONS

First Office Action for Chinese Patent Application No. 201610595758.3 dated Jul. 3, 2018.
(Continued)

*Primary Examiner* — Bilkis Jahan
*Assistant Examiner* — Victor V Barzykin
(74) *Attorney, Agent, or Firm* — Calfee, Halter & Griswold LLP

(57) ABSTRACT

A fingerprint recognition device, a method for fabricating the same, and a display device are disclosed. The first electrically conductive connection member is arranged between the drain of the TFT and photosensitive members,
(Continued)

and the photosensitive members are connected with the drain of the TFT through the first electrically conductive connection member. Even when the surface of the drain becomes rough after first vias are formed in the insulating layer, it is the first electrically conductive connection member that is electrically connected with the photosensitive members. The first electrically conductive connection member has a smooth surface. This prevents the effect of formation of first vias in the insulating layer on the optical property of photosensitive members, thus improving performance of the fingerprint recognition device.

19 Claims, 3 Drawing Sheets

(51) Int. Cl.
  *H01L 27/12* (2006.01)
  *H01L 27/146* (2006.01)
(52) U.S. Cl.
  CPC .. *H01L 27/14623* (2013.01); *H01L 27/14636* (2013.01); *H01L 27/14678* (2013.01); *H01L 27/14685* (2013.01); *H01L 27/14692* (2013.01)
(58) Field of Classification Search
  CPC ......... H01L 27/14678; H01L 27/14685; H01L 27/14692
  See application file for complete search history.

(56) References Cited

U.S. PATENT DOCUMENTS

| | | |
|---|---|---|
| 2010/0155733 A1 | 6/2010 | Moon et al. |
| 2015/0171224 A1 | 6/2015 | Liu et al. |
| 2015/0369661 A1* | 12/2015 | Lin ..................... G06K 9/0004 |
| | | 250/227.11 |
| 2017/0032167 A1 | 2/2017 | Chen et al. |
| 2017/0161541 A1 | 6/2017 | Li et al. |

FOREIGN PATENT DOCUMENTS

| | | |
|---|---|---|
| CN | 104867878 A | 8/2015 |
| CN | 105095872 A | 11/2015 |
| CN | 105243361 A | 1/2016 |
| CN | 105550662 A | 5/2016 |
| CN | 105789226 A | 7/2016 |
| CN | 106129069 A | 11/2016 |
| JP | 09213801 A | 8/1997 |
| KR | 20150029129 A | 3/2015 |

OTHER PUBLICATIONS

Search Report for International Patent Application No. PCT/CN2017/084051 dated Aug. 15, 2017.
Second Office Action for Chinese Patent Application No. 201610595758.3 dated Jan. 30, 2019.

* cited by examiner

FINGERPRINT RECOGNITION DEVICE, METHOD FOR FABRICATING THE SAME AND DISPLAY DEVICE

RELATED APPLICATIONS

The present application is the U.S. national phase entry of PCT/CN2017/084051, with an international filing date of May 12, 2017, which claims the benefit of Chinese Patent Application No. No. 201610595758.3, filed on Jul. 26, 2016, the entire disclosures of which are incorporated herein by reference.

TECHNICAL FIELD

The present disclosure relates to the field of fingerprint recognition technology, and particularly to a fingerprint recognition device, a method for fabricating the same, and a display device.

BACKGROUND

With the rapid development of display technology, a touch screen panel has become popular in the daily life. Currently, according to the operation principle, the touch screen panel can be divided into a resistive type, capacitive type, infrared type, surface acoustic wave type, electromagnetic type, oscillatory wave induction type, frustrated total internal reflection optical induction type, or the like.

In a personal identification system based on the touch screen panel, various recognition methods with aid of a fingerprint have been applied extensively. There are lots of designs for realizing fingerprint recognition. These fingerprint recognition devices generally comprise an insulating layer on thin film transistors (TFTs) and photosensitive members on the insulating layer. The photosensitive members are generally connected with a drain of the TFT through vias which penetrate insulating layer. Since the vias in the insulating layer are generally formed by a dry etching process, the surface of the drain is rough. This adversely affects the optical property of photosensitive members, and thus affects recognition effect of the fingerprint recognition device.

SUMMARY

In view of the foregoing, embodiments of the present disclosure provide a fingerprint recognition device, a method for fabricating the same, and a display device, for preventing the effect of the dry etching process on the optical property of the photosensitive members, and improving performance of the fingerprint recognition device.

Thus, in an embodiment of the present disclosure, a fingerprint recognition device comprises: a base plate, TFTs which are arranged on the base plate, an insulating layer which covers each TFT, and photosensitive members which are arranged above the insulating layer and correspond with each TFT in a one-to-one manner. The fingerprint recognition device further comprises a first electrically conductive connection member which is arranged between a drain of each TFT and a corresponding photosensitive member, the insulating layer is provided with first vias in a region corresponding with the drain of each TFT, the first vias penetrate the insulating layer, the first electrically conductive connection member is arranged in the first vias, and the photosensitive members are electrically connected with the drain of a corresponding TFT through the first electrically conductive connection member.

In an exemplary embodiment of the present disclosure, the fingerprint recognition device further comprises: a shielding layer which is arranged over the insulating layer and covers an active layer of each TFT, wherein the shielding layer and the first electrically conductive connection member are arranged in a same layer and comprise a same material.

In the fingerprint recognition device according to an exemplary embodiment of the present disclosure, the TFTs are arranged in a matrix, and the fingerprint recognition device further comprises: scan lines which correspond with each row of the TFTs in a one-to-one manner and are electrically connected with a gate of each TFT in the corresponding row; fingerprint recognition lines which correspond with each column of TFTs in a one-to-one manner and are electrically connected with a source of each TFT in the corresponding column; and reference signal lines which correspond with and are electrically connected with each photosensitive members in a one-to-one manner.

In the fingerprint recognition device according to an exemplary embodiment of the present disclosure, the reference signal lines are arranged in a same layer as the gate of the TFT.

In an exemplary embodiment of the present disclosure, the fingerprint recognition device further comprises: an insulating protection layer which covers the photosensitive members and the shielding layer, and a second electrically conductive connection member which is arranged over the insulating protection layer and corresponds with each photosensitive members in a one-to-one manner, wherein the second electrically conductive connection member is electrically connected with the photosensitive members through second vias which penetrate the insulating protection layer, and the photosensitive members are electrically connected with the reference signal lines through the corresponding second electrically conductive connection member.

In the fingerprint recognition device according to an exemplary embodiment of the present disclosure, both the source and the drain of the TFT are arranged over the active layer, and a gate insulating layer and the gate are arranged in sequence below the active layer, and the fingerprint recognition device further comprises a third electrically conductive connection member which is arranged between the reference signal lines and the second electrically conductive connection member, wherein the second electrically conductive connection member is electrically connected with the reference signal lines through the third electrically conductive connection member.

In the fingerprint recognition device according to an exemplary embodiment of the present disclosure, the third electrically conductive connection member and the shielding layer are arranged in a same layer and comprise a same material, the second electrically conductive connection member is electrically connected with the third electrically conductive connection member through third vias which penetrate the insulating protection layer, and the third electrically conductive connection member is electrically connected with the reference signal lines through fourth vias which penetrate the insulating layer and the gate insulating layer.

In an exemplary embodiment of the present disclosure, the fingerprint recognition device further comprises an etching barrier layer which is arranged between the active layer and the drain of the TFT. The third electrically conductive connection member comprises a first sub-connection member and a second sub-connection member, the first sub-connection member and the shielding layer are arranged in a same layer and comprise a same material, and the second sub-connection member and the drain of the TFT are arranged in a same layer and comprise a same material. The second electrically conductive connection member is electrically connected with the first sub-connection member through third vias which penetrate the insulating protection layer, the first sub-connection member is electrically connected with the second sub-connection member through fifth vias which penetrate the insulating layer, and the second sub-connection member is electrically connected with the reference signal lines through fourth vias which penetrate the etching barrier layer and the gate insulating layer.

In an exemplary embodiment of the present disclosure, the fingerprint recognition device further comprises a fourth electrically conductive connection member which is arranged between the second electrically conductive connection member and the photosensitive members, and which is arranged below the insulating protection layer, wherein the second electrically conductive connection member is electrically connected with the photosensitive members through the fourth electrically conductive connection member.

In the fingerprint recognition device according to an exemplary embodiment of the present disclosure, the second electrically conductive connection member and the fourth electrically conductive connection member are made from a transparent electrically conductive oxide.

Accordingly, an embodiment of the present disclosure further provides a display device, which comprises any fingerprint recognition device in the above embodiments of the present disclosure.

Accordingly, an embodiment of the present disclosure further provides a method for fabricating a fingerprint recognition device, comprising: forming a pattern comprising TFTs on a base plate; forming a pattern comprising an insulating layer which covers each TFT, wherein the insulating layer is provided with first vias in a region corresponding with a drain of each TFT, and the first vias penetrate the insulating layer; forming a pattern comprising a first electrically conductive connection member in each of the first vias, wherein the first electrically conductive connection member is electrically connected with a drain of the TFT; and forming a pattern comprising photosensitive members which correspond with each TFT in a one-to-one manner on the insulating layer, wherein the photosensitive members are electrically connected with the drain of corresponding TFT through the first vias.

In the method in an exemplary embodiment of the present disclosure, forming the pattern comprising the first electrically conductive connection member comprises:

forming a shielding film on the base plate on which the pattern comprising the insulating layer has been formed; and patterning the shielding film, to forming a pattern comprising a shielding layer in a region where an active layer of each TFT is located and the pattern comprising the first electrically conductive connection member in each of the first vias.

In the method in an exemplary embodiment of the present disclosure, the TFTs are arranged in a matrix, and the method further comprises:

forming a pattern comprising scan lines which correspond with each row of the TFTs in a one-to-one manner and are electrically connected with a gate of each TFT in the corresponding row, a pattern comprising fingerprint recognition lines which correspond with each column of TFTs in a one-to-one manner and are electrically connected with a source of each TFT in the corresponding column, and a pattern comprising reference signal lines which correspond with and are electrically connected with each photosensitive members in a one-to-one manner.

In the method in an exemplary embodiment of the present disclosure, forming the pattern comprising the TFTs and the pattern comprising the reference signal lines comprises:

forming a pattern comprising gates and reference signal lines on the base plate;

forming a gate insulating layer which covers the gate and the reference signal lines;

forming a pattern comprising the active layer which corresponds with each the gate on the gate insulating layer; and forming a pattern comprising the source and the drain on the active layer.

In an exemplary embodiment of the present disclosure, the above method further comprises:

at a same time as forming the pattern comprising the insulating layer, forming fourth vias which penetrate the insulating layer and the gate insulating layer, wherein each of the fourth vias is arranged a region which corresponds with each of the reference signal lines; and at a same time as patterning the shielding film, forming a pattern comprising a third electrically conductive connection member which corresponds with each of the reference signal lines in a one-to-one manner, wherein the third electrically conductive connection member is electrically connected with the corresponding reference signal line through the fourth vias.

In an exemplary embodiment of the present disclosure, after forming the pattern comprising the photosensitive members, the method further comprises:

forming an insulating protection layer;

by patterning for one time, forming second vias which penetrate the insulating protection layer in a region corresponding with each photosensitive member, and forming third vias which penetrate the insulating protection layer in a region corresponding with each third electrically conductive connection member; and forming a pattern comprising a second electrically conductive connection member which corresponds with each photosensitive members in a one-to-one manner on the insulating protection layer, wherein the second electrically conductive connection member is electrically connected with the photosensitive members through the second vias, and the second electrically conductive connection member is electrically connected with the third electrically conductive connection member through the third vias.

In an exemplary embodiment of the present disclosure, after forming the pattern comprising the active layer, and prior to forming the pattern comprising the source and the drain, the method further comprises:

forming an etching barrier layer, and forming fourth vias which penetrate the etching barrier layer and the gate insulating layer;

at a same time as forming the pattern comprising the source and the drain, forming a pattern comprising a second sub-connection member which corresponds with each of the fourth vias in a one-to-one manner, wherein the second sub-connection member is electrically connected with the reference signal lines through the fourth vias;

at a same time as forming the pattern comprising the insulating layer, forming fifth vias which penetrate the insulating layer in a region corresponding with the second sub-connection member; and at a same time as patterning the shielding film, forming a pattern comprising a first sub-connection member which is electrically connected with the second sub-connection member in a one-to-one manner, wherein the first sub-connection member is electrically connected with the second sub-connection member through the fifth vias.

In an exemplary embodiment of the present disclosure, after forming the pattern comprising photosensitive members, the method further comprises:

forming an insulating protection layer;

by patterning for one time, forming second vias which penetrate the insulating protection layer in a region corresponding with each photosensitive member, and forming third vias which penetrate the insulating protection layer and the insulating layer in a region corresponding with the first sub-connection member; and forming a pattern comprising a second electrically conductive connection member which corresponds with each photosensitive members in a one-to-one manner on the insulating protection layer, wherein the second electrically conductive connection member is electrically connected with the photosensitive members through the second vias, and the second electrically conductive connection member is electrically connected with the first sub-connection member through the third vias.

In an exemplary embodiment of the present disclosure, after forming the photosensitive member, and prior to forming the second electrically conductive connection member, the method further comprises: forming a pattern comprising a fourth electrically conductive connection member on the photosensitive members, wherein the fourth electrically conductive connection member is electrically connected with the photosensitive members.

DETAILED DESCRIPTION OF EMBODIMENTS

To make the objects, the technical solutions and the advantages of embodiments of the present disclosure more apparent, the technical solutions of the fingerprint recognition device, the method for fabricating the same and the display device the embodiments of the present disclosure will be described in detail hereinafter in conjunction with the drawings of the embodiments of the present disclosure.

The shape and size of films in drawings do not reflect the true scale of the fingerprint recognition device, but show a local construction of the fingerprint recognition device, for the purpose of illustrating the content of the present disclosure.

Figure 1:
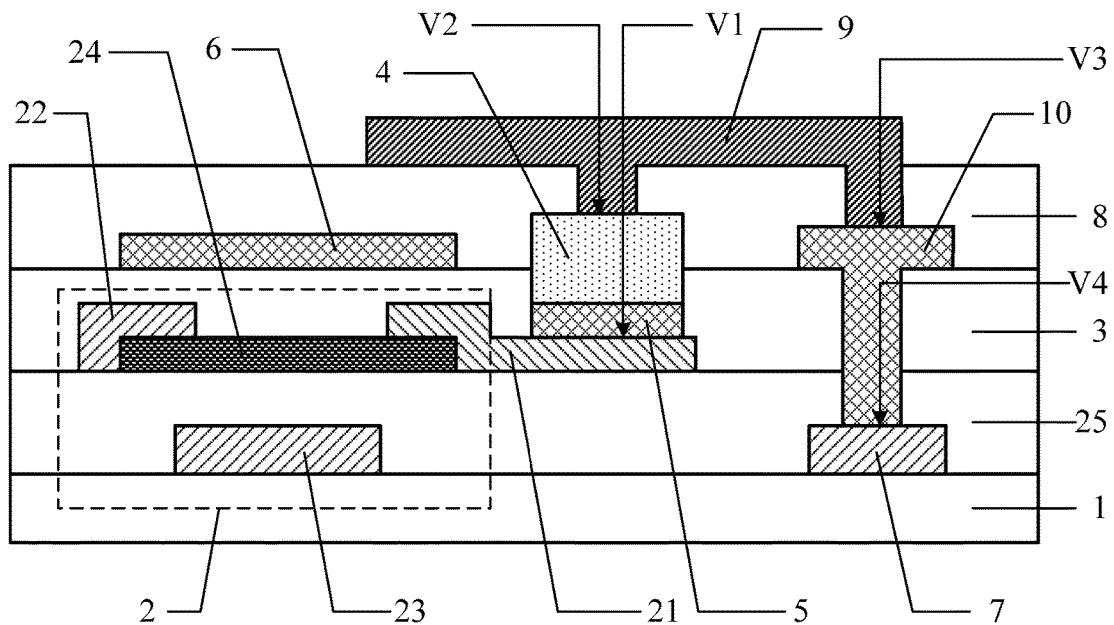
FIG. 1 is a structural view for illustrating a fingerprint recognition device in an embodiment of the present disclosure.
Figure 2:
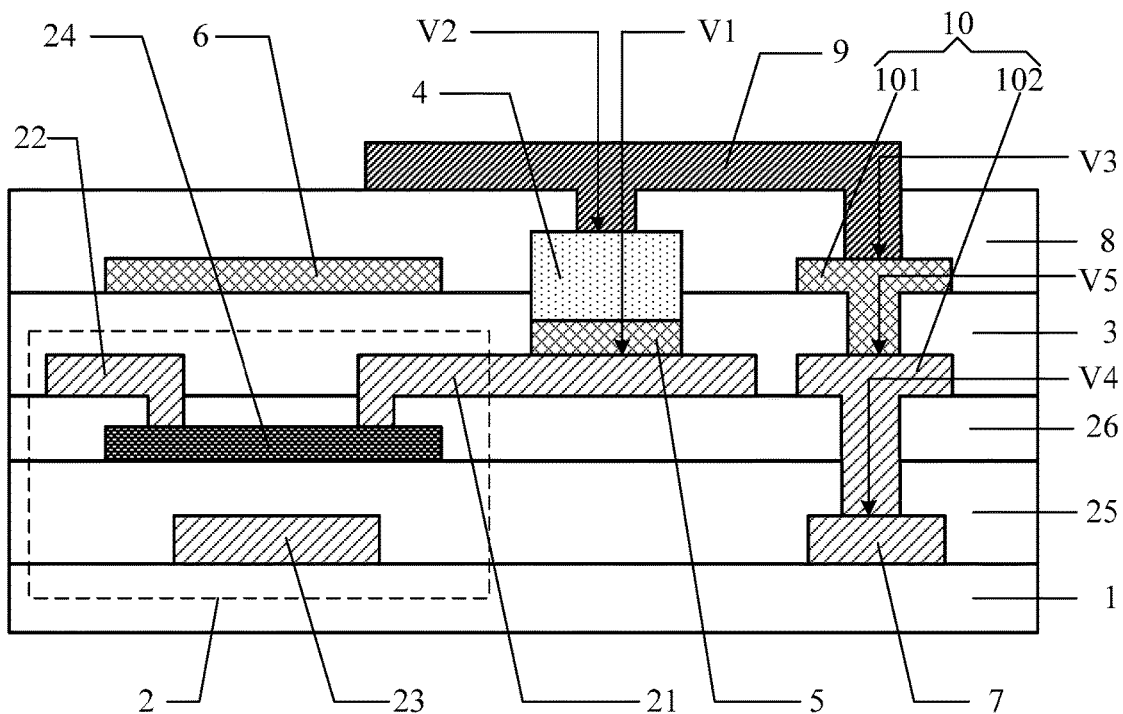
FIG. 2 is a structural view for illustrating a fingerprint recognition device in an embodiment of the present disclosure.

In an embodiment, as shown in FIG. 1 and FIG. 2, the fingerprint recognition device comprises: a base plate 1, TFTs 2 on the base plate 1, an insulating layer 3 which covering each TFT 2, and photosensitive members 4 which are arranged over the insulating layer 3 and corresponds with each TFT 2 in a one-to-one manner.

The fingerprint recognition device further comprises a first electrically conductive connection member 5 which is arranged between a drain 21 of each TFT 2 and a corresponding one of the photosensitive members 4. The insulating layer 3 is provided with first vias V1 which penetrate the insulating layer 3, at a region corresponding with the drain 21 of each TFT 2. The first electrically conductive connection member 5 is arranged in the first vias V1, and photosensitive members 4 are electrically connected with the drain 21 of the corresponding TFT 2 through the first electrically conductive connection member 5.

In the fingerprint recognition device according to embodiments of the present disclosure, the first electrically conductive connection member is arranged between the drain of the TFT and photosensitive members, and the photosensitive members are connected with the drain of the TFT through the first electrically conductive connection member. Even when the surface of the drain becomes rough after first vias are formed in the insulating layer, it is the first electrically conductive connection member that is electrically connected with the photosensitive members. The first electrically conductive connection member has a smooth surface. This prevents the effect of formation of first vias in the insulating layer on the optical property of photosensitive members, thus improving performance of the fingerprint recognition device.

Furthermore, in an embodiment, in order to prevent effect of light irradiation on the TFTs, as shown in FIG. 1 and FIG. 2, the fingerprint recognition device further comprises a shielding layer 6 which is arranged over the insulating layer 3 and covers an active layer of each TFT 2. The expression "a shielding layer which covers an active layer" as used herein indicates that a projection of the shielding layer in the vertical direction is larger than a projection of the active layer in the vertical direction, and one or more other layers may be present between the shielding layer and the active layer. The vertical direction for example is a direction perpendicular to the surface of the base plate 1.

For example, in an embodiment, as shown in FIG. 1 and FIG. 2, the shielding layer 6 and the first electrically conductive connection member 5 are arranged in a same layer and comprise a same material. In this way, during fabrication, the shielding layer and the first electrically conductive connection member can be formed by patterning for one time, so that the fabricating process is simplified, and the production cost is reduced.

Furthermore, in the fingerprint recognition device according to an embodiment of the present disclosure, the TFTs are arranged in a matrix. The fingerprint recognition device further comprises: scan lines which correspond with each row of TFTs 2 in a one-to-one manner and are electrically connected with a gate 23 of each TFT in the corresponding row, fingerprint recognition lines which correspond with each column of TFTs 2 in a one-to-one manner and are electrically connected with a source 22 of each TFT in the corresponding column, and reference signal lines 7 which correspond with and are electrically connected with each of the photosensitive members 4 in a one-to-one manner.

Therefore in implementations, a constant voltage is applied to all reference signal lines. When the TFTs which control the scan lines are turned on, the voltage is supplied to the drain of TFTs through the fingerprint recognition lines, so that the photosensitive members are reverse biased.

When the scan lines turn on the TFT next time, signals on the fingerprint recognition lines are detected. In case a finger touch occurs, different portions of the fingerprint induce different intensities of light received by the photosensitive members at the corresponding regions. As a result, the difference of voltage across photosensitive members is different. In this way, fingerprint touch control is realized by detecting signals on the fingerprint recognition lines.

In implementations, in the fingerprint recognition device according to an embodiment of the present disclosure, the photosensitive members are photosensitive diodes, but embodiments of the present disclosure are not limited in this regard.

Furthermore, in the fingerprint recognition device according to an embodiment of the present disclosure, in case the photosensitive members are photosensitive diodes, the photosensitive diodes have a P pole at a lower potential and a N pole at a high potential, and the photosensitive diodes are reverse biased.

It is noted that in the fingerprint recognition device according to an embodiment of the present disclosure, the direction in which the scan lines extend is defined as a row direction, and the direction in which the fingerprint recognition lines extend is defined as a column direction.

For example, for purpose of simplifying the fabricating process, in the fingerprint recognition device according to an embodiment of the present disclosure, the scan lines and the gate of TFTs are arranged in a same layer and comprise a same material.

For example, for purpose of simplifying the fabricating process, in the fingerprint recognition device according to an embodiment of the present disclosure, the fingerprint recognition lines and the source of TFTs are arranged in a same layer and comprise a same material.

For example, for purpose of simplifying the fabricating process, in the fingerprint recognition device according to an embodiment of the present disclosure, as shown in FIG. 1 and FIG. 2, the reference signal lines 7 and the gate 23 of TFT 2 are arranged in a same layer.

Furthermore, in an embodiment, in order to protect a side face of photosensitive members 4, as shown in FIG. 1 and FIG. 2, the fingerprint recognition device further comprises: an insulating protection layer 8 which covers the photosensitive members 4 and the shielding layer 6.

In an embodiment, in order to realize electrical connection between the photosensitive members 4 and the reference signal lines 7, as shown in FIG. 1 and FIG. 2, the fingerprint recognition device further comprises: a second electrically conductive connection member 9 which is arranged over the insulating protection layer 8 and corresponds with each of the photosensitive members 4 in a one-to-one manner. The second electrically conductive connection member 9 is electrically connected with the photosensitive members 4 through second vias V2 which penetrate the insulating protection layer 8, and the photosensitive members 4 is electrically connected with the reference signal lines 7 through the corresponding second electrically conductive connection member 9.

In implementations, the second electrically conductive connection member 9 realizes electrical connection through vias which penetrate multiple layers between the second electrically conductive connection member and the reference signal lines.

Since it is difficult to form vias which penetrate multiple layers, in an embodiment, as shown in FIG. 1 and FIG. 2, both the source 22 and the drain 21 of TFT 2 are arranged over an active layer 24, and a gate insulating layer 25 and the gate 23 are arranged in sequence below the active layer 24. The fingerprint recognition device further comprises: a third electrically conductive connection member 10 which is arranged between the reference signal lines 7 and the second electrically conductive connection member 9. The second electrically conductive connection member 9 is electrically connected with the reference signal lines 7 through the third electrically conductive connection member 10.

The manner in which the second electrically conductive connection member is electrically connected with the reference signal lines through the third electrically conductive connection member will be described hereinafter by referring two specific embodiments.

For example, in an embodiment of the fingerprint recognition device, as shown in FIG. 1, the third electrically conductive connection member 10 and the shielding layer 6 are arranged in a same layer and comprise a same material. The second electrically conductive connection member 9 is electrically connected with the third electrically conductive connection member 10 through third vias V3 which penetrate the insulating protection layer 8. The third electrically conductive connection member 10 is electrically connected with the reference signal lines 7 through fourth vias V4 which penetrate the insulating layer 3 and the gate insulating layer 25.

In this way, the fourth vias and the first vias are formed at a same time by patterning for one time, the shielding layer and the third electrically conductive connection member are formed at a same time by patterning for one time, and the second vias and the third vias are formed at a same time by patterning for one time. Therefore, it is not necessary to increase the number of masks. This simplifies the fabricating process and reduces production cost.

In an embodiment, in order to prevent the photolithographic process for forming the source 22 and the drain 21 from affecting the active layer 24, for example, as shown in FIG. 2, the fingerprint recognition device further comprises an etching barrier layer 26 which is arranged between the active layer 24 and the drain 21 of the TFT 2.

The third electrically conductive connection member 10 comprises a first sub-connection member 101 and a second sub-connection member 102. The first sub-connection member 101 is arranged in a same layer and comprises a same material as the shielding layer 6, and the second sub-connection member 102 is arranged in a same layer and comprises a same material as the drain 21 of the TFT 2. The second electrically conductive connection member 9 is electrically connected with the first sub-connection member 101 through third vias V3 which penetrate the insulating protection layer 8. The first sub-connection member 101 is electrically connected with the second sub-connection member 102 through fifth vias V5 which penetrate the insulating layer 3. The second sub-connection member 102 is electrically connected with the reference signal lines 7 through fourth vias V4 which penetrate the etching barrier layer 26 and the gate insulating layer 25.

In this way, the shielding layer and the first sub-connection member are formed at a same time by patterning for one time, the source and drain and the second sub-connection member are formed at a same time by patterning for one time, the vias for electrically connecting the active layer with the source and drain and the fourth vias are formed at a same time by patterning for one time, the first vias and the fifth vias are formed at a same time by patterning for one time, and the second vias the third vias are formed at a same time by patterning for one time. Therefore, it is not necessary to increase the number of masks. This simplifies the fabricating process and reduces production cost.

In implementations, in the fingerprint recognition device according to an embodiment of the present disclosure, the active layer of the TFT comprises poly-crystalline silicon or a metal oxide.

It is noted that in the fingerprint recognition device according to embodiments of the present disclosure, since it is required that the photosensitive members should be electrically connected with the drain of the TFT, reference is made to a bottom-gate TFT in the above embodiments, which facilitates electrical connection between the photosensitive members and the drain. Of course, in implementations, a top-gate TFT is also applicable.

Figure 3:
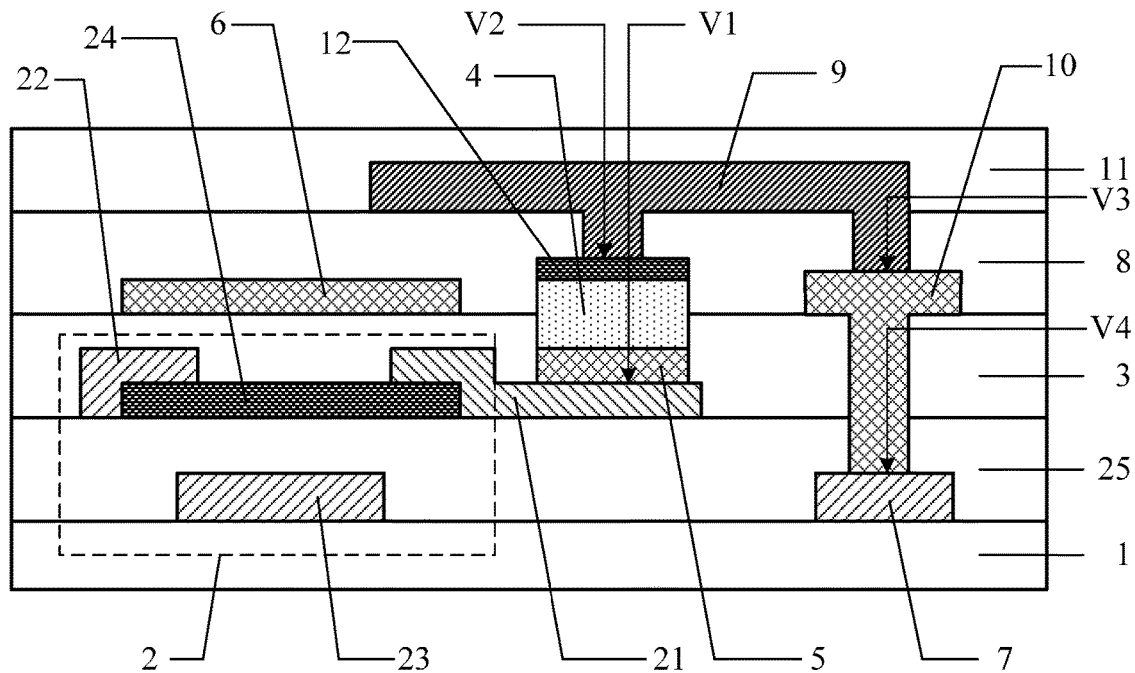
FIG. 3 is a structural view for illustrating a fingerprint recognition device in an embodiment of the present disclosure.
Figure 4:
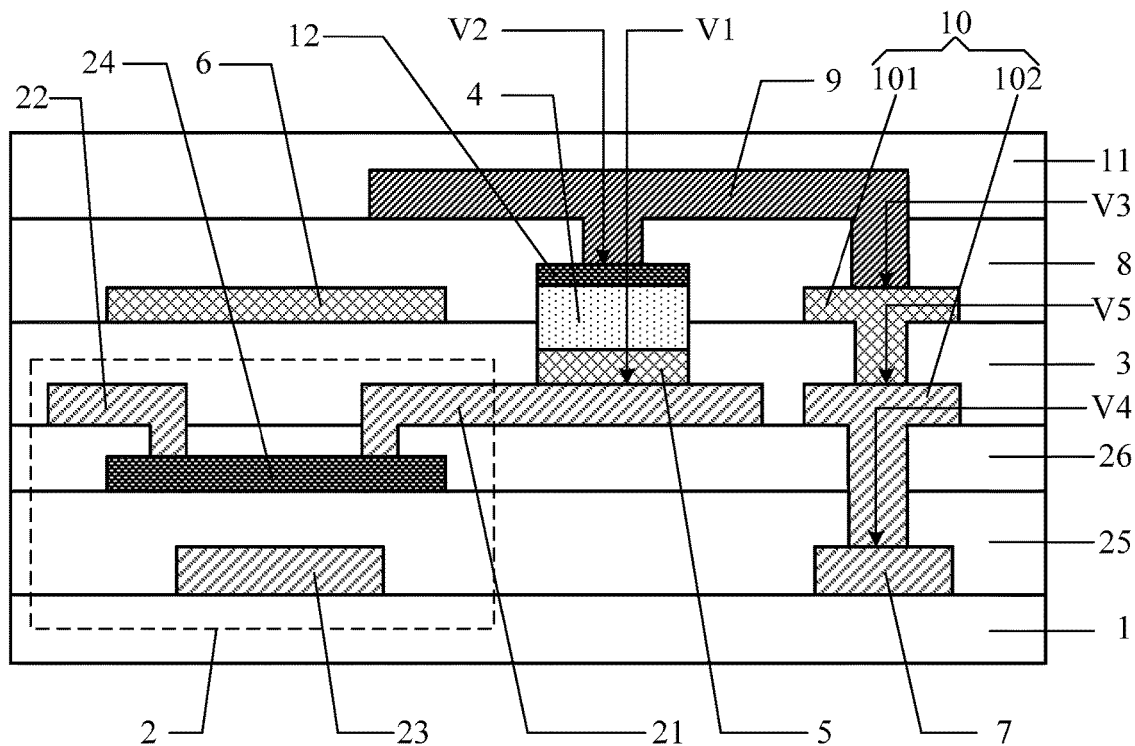
FIG. 4 is a structural view for illustrating a fingerprint recognition device in an embodiment of the present disclosure.

In an embodiment, as shown in FIG. 3 and FIG. 4, the fingerprint recognition device further comprises a resin layer 11 which covers the second electrically conductive connection member 9. This protects the second electrically conductive connection member 9. The resin layer 11 increases adhesive force with respect to the film to be formed, and the leakage current is also reduced.

For example, in an embodiment, as shown in FIG. 3 and FIG. 4, the fingerprint recognition device further comprises a fourth electrically conductive connection member 12 which is arranged between the second electrically conductive connection member 9 and the photosensitive members 4 and arranged below the insulating protection layer 8. This prevents the upper surface of photosensitive members 4 from becoming rough during forming second vias V2 in the insulating protection layer 8, which otherwise would affect the optical property of the photosensitive members 4.

In implementations, in the fingerprint recognition device according to an embodiment of the present disclosure, the second electrically conductive connection member 9 comprises a transparent electrically conductive oxide.

In implementations, in the fingerprint recognition device according to an embodiment of the present disclosure, the fourth electrically conductive connection member 12 comprises a transparent electrically conductive oxide.

Figure 5:
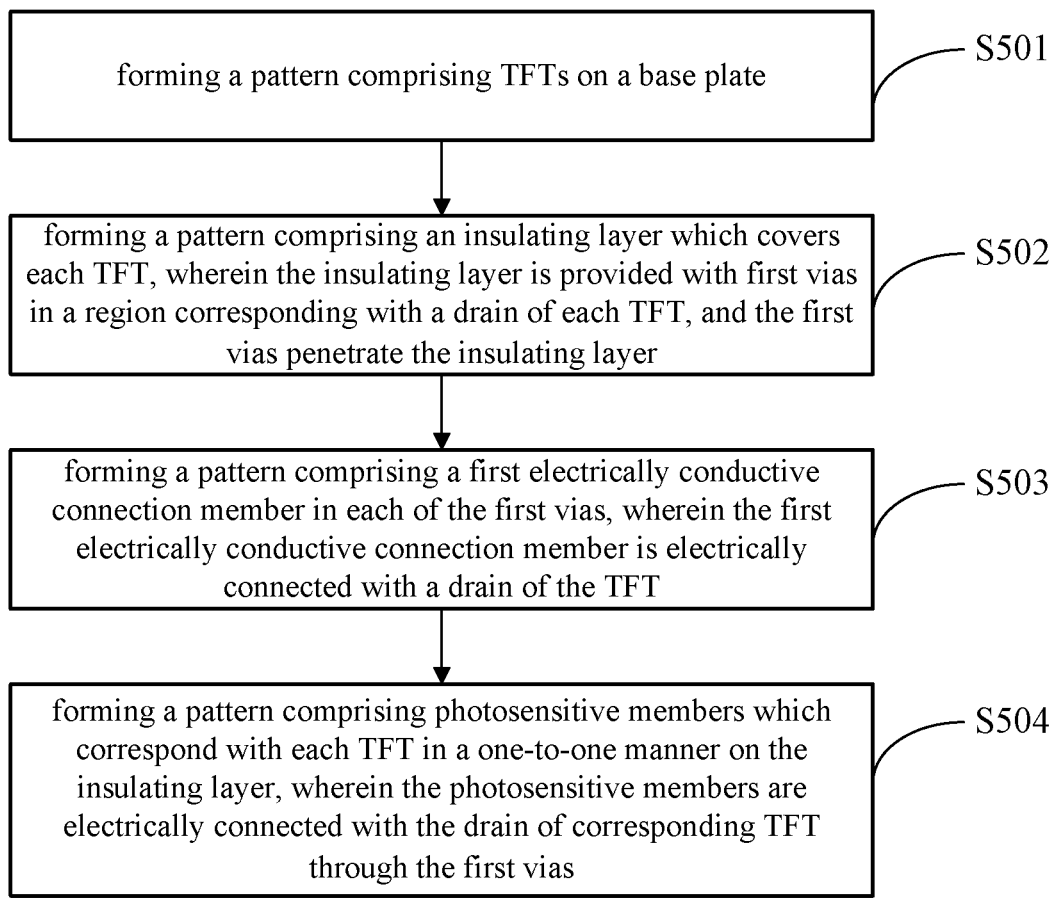
FIG. 5 is a flow chart for illustrating a method for fabricating a fingerprint recognition device.

On basis of a same inventive concept, embodiments of the present disclosure further provide a method for fabricating a fingerprint recognition device. As shown in FIG. 5, the method comprises:

S501, forming a pattern comprising TFTs on a base plate;

S502, forming a pattern comprising an insulating layer which covers each TFT, wherein the insulating layer is provided with first vias in a region corresponding with a drain of each TFT, and the first vias penetrate the insulating layer;

S503, forming a pattern comprising a first electrically conductive connection member in each of the first vias, wherein the first electrically conductive connection member is electrically connected with a drain of the TFT; and S504, forming a pattern comprising photosensitive members which correspond with each TFT in a one-to-one manner on the insulating layer, wherein the photosensitive members are electrically connected with the drain of corresponding TFT through the first vias.

In an embodiment of the present disclosure, after forming the pattern comprising the insulating layer, and prior to forming the pattern comprising the photosensitive members, the method further comprises: forming a pattern comprising a first electrically conductive connection member in each of the first vias, wherein the first electrically conductive connection member is electrically connected with the drain of the TFT. Even when the surface of the drain becomes rough after first vias are formed in the insulating layer, it is the first electrically conductive connection member that is electrically connected with the photosensitive members. The first electrically conductive connection member has a smooth surface. This prevents the effect of formation of first vias in the insulating layer on the optical property of photosensitive members, thus improving performance of the fingerprint recognition device.

In implementations, for purpose of simplifying the fabricating process, in the method in an embodiment of the present disclosure, forming the pattern comprising the first electrically conductive connection member comprises:

forming a shielding film on the base plate on which the pattern comprising the insulating layer has been formed; and patterning the shielding film, to forming a pattern comprising a shielding layer in a region where an active layer of each TFT is located and the pattern comprising the first electrically conductive connection member in each of the first vias.

In implementations, for purpose of simplifying the fabricating process, in the method in an embodiment of the present disclosure, the TFTs are arranged in a matrix, and the method further comprises:

forming a pattern comprising scan lines which correspond with each row of the TFTs in a one-to-one manner and are electrically connected with a gate of each TFT in the corresponding row, a pattern comprising fingerprint recognition lines which correspond with each column of TFTs in a one-to-one manner and are electrically connected with a source of each TFT in the corresponding column, and a pattern comprising reference signal lines which correspond with and are electrically connected with each photosensitive members in a one-to-one manner.

In implementations, for purpose of simplifying the fabricating process, in the method in an embodiment of the present disclosure, forming the pattern comprising the TFTs and the pattern comprising the reference signal lines comprise:

forming a pattern comprising gates and reference signal lines on the base plate;

forming a gate insulating layer which covers the gate and the reference signal lines;

forming a pattern comprising the active layer which corresponds with each the gate on the gate insulating layer; and forming a pattern comprising the source and the drain on the active layer.

In implementations, for purpose of simplifying the fabricating process, in the method in an embodiment of the present disclosure, at a same time as forming the pattern comprising the insulating layer, forming fourth vias which penetrate the insulating layer and the gate insulating layer, wherein each of the fourth vias is arranged a region which corresponds with each of the reference signal lines; and at a same time as patterning the shielding film, forming a pattern comprising a third electrically conductive connection member which corresponds with each of the reference signal lines in a one-to-one manner, wherein the third electrically conductive connection member is electrically connected with the corresponding reference signal line through the fourth vias.

After forming the pattern comprising the photosensitive members, the method further comprises:

forming an insulating protection layer;

by patterning for one time, forming second vias which penetrate the insulating protection layer in a region corresponding with each photosensitive member, and forming third vias which penetrate the insulating protection layer in a region corresponding with each third electrically conductive connection member; and forming a pattern comprising a second electrically conductive connection member which corresponds with each photosensitive members in a one-to-one manner on the insulating protection layer, wherein the second electrically conductive connection member is electrically connected with the photosensitive members through the second vias, and the second electrically conductive connection member is electrically connected with the third electrically conductive connection member through the third vias.

Alternatively, in implementations, for purpose of simplifying the fabricating process, in the method in an embodiment of the present disclosure, after forming the pattern comprising the active layer, and prior to forming the pattern comprising the source and the drain, the method further comprises:

forming an etching barrier layer, and forming fourth vias which penetrate the etching barrier layer and the gate insulating layer;

at a same time as forming the pattern comprising the source and the drain, forming a pattern comprising a second sub-connection member which corresponds with each of the fourth vias in a one-to-one manner, wherein the second sub-connection member is electrically connected with the reference signal lines through the fourth vias;

at a same time as forming the pattern comprising the insulating layer, forming fifth vias which penetrate the insulating layer in a region corresponding with the second sub-connection member; and at a same time as patterning the shielding film, forming a pattern comprising a first sub-connection member which is electrically connected with the second sub-connection member in a one-to-one manner, wherein the first sub-connection member is electrically connected with the second sub-connection member through the fifth vias.

After forming the pattern comprising photosensitive members, the method further comprises:

forming an insulating protection layer;

by patterning for one time, forming second vias which penetrate the insulating protection layer in a region corresponding with each photosensitive member, and forming third vias which penetrate the insulating protection layer and the insulating layer in a region corresponding with the first sub-connection member; and forming a pattern comprising a second electrically conductive connection member which corresponds with each photosensitive members in a one-to-one manner on the insulating protection layer, wherein the second electrically conductive connection member is electrically connected with the photosensitive members through the second vias, and the second electrically conductive connection member is electrically connected with the first sub-connection member through the third vias.

Furthermore, in the method in an embodiment of the present disclosure, after forming the pattern comprising the second electrically conductive connection member, the method further comprises forming a resin layer which covers the second electrically conductive connection member.

For example, in the method in an embodiment of the present disclosure, after forming the photosensitive members, and prior to forming the insulating protection layer, the method further comprises forming a pattern comprising a fourth electrically conductive connection member over the photosensitive members. This prevents the upper surface of the photosensitive members from becoming rough during forming the second vias in the insulating protection layer, which otherwise would affect the optical property of the photosensitive members.

The method for fabricating a fingerprint recognition device in an embodiment of the present disclosure will be described hereinafter, by taking the fingerprint recognition device shown in FIG. 1 to FIG. 4 as an example.

In an embodiment, by taking the fingerprint recognition device shown in FIG. 1 as an example, the method for fabricating the fingerprint recognition device comprises:

(A1) forming a pattern comprising the gate 23 and the reference signal lines 7 on the base plate 1 by patterning for one time;

(A2) forming the gate insulating layer 25 which covers the gate 23 and the reference signal lines 7;

(A3) forming a pattern comprising the active layer 24 on the gate insulating layer 25;

(A4) forming a pattern comprising the source 22 and the drain 21 on the active layer 24 by patterning for one time;

(A5) forming the insulating layer 3 which covers the source 22 and the drain 21;

(A6) forming the first vias V1 which penetrate the insulating layer 3 in a region corresponding with the drain 21 by patterning for one time, and forming fourth vias V4 which penetrate the insulating layer 3 and the gate insulating layer 25 in a region corresponding with the reference signal lines 7;

(A7) forming a pattern comprising the shielding layer 6, the first electrically conductive connection member 5 and the third electrically conductive connection member 10 by patterning for one time, wherein the first electrically conductive connection member 5 is electrically connected with the drain 21 through the first vias V1, the third electrically conductive connection member 10 is electrically connected with the reference signal lines 7 through fourth vias V4;

(A8) forming a pattern comprising the photosensitive members 4 on the first electrically conductive connection member 5, wherein the photosensitive members 4 are electrically connected with the first electrically conductive connection member 5;

(A9) forming the insulating protection layer 8 which covers photosensitive members 4;

(A10) by patterning for one time, forming second vias V2 which penetrate the insulating protection layer 8 in a region corresponding with the photosensitive members 4, and forming third vias V3 which penetrate the insulating protection layer 8 in a region corresponding with the third electrically conductive connection member 10; and (A11) forming a pattern comprising the second electrically conductive connection member 9, wherein the second electrically conductive connection member 9 is electrically connected with the photosensitive members 4 through second vias V2, and the second electrically conductive connection member 9 is electrically connected with the third electrically conductive connection member 10 through third vias V3.

Through the above steps (A1)~(A11), the fingerprint recognition device shown in FIG. 1 is completed.

In an embodiment, by taking the fingerprint recognition device shown in FIG. 3 as an example, the method for fabricating the fingerprint recognition device comprises steps (A1)~(A8), and further comprises:

(B9) form a pattern comprising the fourth electrically conductive connection member 12 on the photosensitive members 4, wherein the fourth electrically conductive connection member 12 is electrically connected with the photosensitive members 4;

(B10) forming the insulating protection layer 8 which covers the fourth electrically conductive connection member 12;

(B11) by patterning for one time, forming second vias V2 which penetrate the insulating protection layer 8 in a region corresponding with the fourth electrically conductive connection member 12, and forming third vias V3 which penetrate the insulating protection layer 8 in a region corresponding with the third electrically conductive connection member 10;

(B12) forming a pattern comprising the second electrically conductive connection member 9, wherein the second electrically conductive connection member 9 is electrically connected with the fourth electrically conductive connection member 12 through the second vias V2, and the second electrically conductive connection member 9 is electrically connected with the third electrically conductive connection member 10 through third vias V3; and (B13) forming the resin layer 11 which covers the second electrically conductive connection member 9.

Through the above steps (A1)~(A8) and (B9)~(B13), the fingerprint recognition device shown in FIG. 3 is completed.

In an embodiment, by taking the fingerprint recognition device shown in FIG. 2 as an example, the method for fabricating the fingerprint recognition device comprises:

(C1) by patterning for one time, forming a pattern comprising the gate 23 and the reference signal lines 7 on the base plate 1;

(C2) forming the gate insulating layer 25 which covers the gate 23 and the reference signal lines 7;

(C3) forming a pattern comprising the active layer 24 on the gate insulating layer 25;

(C4) forming the etching barrier layer 26 which covers the active layer 24;

(C5) by patterning for one time, forming vias which penetrate the etching barrier layer 26 in a region corresponding with the drain 21 and the source 22, and forming fourth vias V4 which penetrate the etching barrier layer 26 and the gate insulating layer 25 in a region corresponding with the reference signal lines 7;

(C6) by patterning for one time, forming a pattern comprising the source 22, the drain 21 and the second sub-connection member 102 on the active layer 24, wherein the second sub-connection member 102 is electrically connected with the reference signal lines 7 through fourth vias V4;

(C7) forming the insulating layer 3 which covers the source 22, the drain 21 and the second sub-connection member 102;

(C8) by patterning for one time, forming the first vias V1 which penetrate the insulating layer 3 in a region corresponding with the drain 21, and forming fifth vias V5 which penetrate the insulating layer 3 in a region corresponding with the second sub-connection member 102;

(C9) by patterning for one time, forming a pattern comprising the shielding layer 6, the first electrically conductive connection member 5 and the first sub-connection member 101, wherein the first electrically conductive connection member 5 is electrically connected with the drain 21 through the first vias V1, the first sub-connection member 101 is electrically connected with the second sub-connection member 102 through fifth vias V5;

(C10) forming a pattern comprising the photosensitive members 4 on the first electrically conductive connection member 5, wherein the photosensitive members 4 are electrically connected with the first electrically conductive connection member 5;

(C11) forming the insulating protection layer 8 which covers photosensitive members 4;

(C12) by patterning for one time, forming second vias V2 which penetrate the insulating protection layer 8 in a region corresponding with the photosensitive members 4, and forming which third vias V3 penetrate the insulating protection layer 8 in a region corresponding with the first sub-connection member 101; and (C13) forming a pattern comprising the second electrically conductive connection member 9, wherein the second electrically conductive connection member 9 is electrically connected with the photosensitive members 4 through second vias V2, and the second electrically conductive connection member 9 is electrically connected with the first sub-connection member 101 through third vias V3.

Through the above steps (C1)~(C13), the fingerprint recognition device shown in FIG. 2 is completed.

In an embodiment, by taking the fingerprint recognition device shown in FIG. 4 as an example, the method for fabricating the fingerprint recognition device comprises steps (C1)~(C10), and further comprises:

(D11) forming a pattern comprising the fourth electrically conductive connection member 12 on the photosensitive members 4, wherein the fourth electrically conductive connection member 12 is electrically connected with the photosensitive members 4;

(D12) forming the insulating protection layer 8 which covers the fourth electrically conductive connection member 12;

(D13) by patterning for one time, forming second vias V2 which penetrate the insulating protection layer 8 in a region corresponding with the fourth electrically conductive connection member 12, and forming third vias V3 which penetrate the insulating protection layer 8 in a region corresponding with the first sub-connection member 101;

(D14) forming a pattern comprising the second electrically conductive connection member 9, wherein the second electrically conductive connection member 9 is electrically connected with the fourth electrically conductive connection member 12 through second vias V2, and the second electrically conductive connection member 9 is electrically connected with the first sub-connection member 101 through third vias V3; and (D15) forming the resin layer 11 which covers the second electrically conductive connection member 9.

Through the above steps (C1)~(C10) and (D11)~(D15), the fingerprint recognition device shown in FIG. 4 is completed.

On basis of a same inventive concept, embodiments of the present disclosure further provide a display device, comprising any fingerprint recognition device as described in the above embodiments. The display device for example is a liquid crystal display device. For example, the display device can be applied to any product or component with a display function like a mobile phone, tablet computer, TV, monitor, notebook computer, digital photo frame, and navigator. The display device has similar embodiments with those of the fingerprint recognition device.

In the fingerprint recognition device, the method for fabricating the same, and the display device according to the above embodiments of the present disclosure, the first electrically conductive connection member is arranged between the drain of the TFT and photosensitive members, and the photosensitive members are connected with the drain of the TFT through the first electrically conductive connection member. Even when the surface of the drain becomes rough after first vias are formed in the insulating layer, it is the first electrically conductive connection member that is electrically connected with the photosensitive members. The first electrically conductive connection member has a smooth surface. This prevents the effect of formation of first vias in the insulating layer on the optical property of photosensitive members, thus improving performance of the fingerprint recognition device.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A fingerprint recognition device, comprising: a base plate, TFTs which are arranged on the base plate, an insulating layer which covers each TFT, and photosensitive members which are arranged above the insulating layer and correspond with each TFT in a one-to-one manner,
    wherein the fingerprint recognition device further comprises a first electrically conductive connection member which is arranged between a drain of each TFT and a corresponding photosensitive member, the insulating layer is provided with first vias in a region corresponding with the drain of each TFT, the first vias penetrate the insulating layer, the first electrically conductive connection member is arranged in the first vias, and the photosensitive members are electrically connected with the drain of a corresponding TFT through the first electrically conductive connection member, and
    wherein the fingerprint recognition device further comprises reference signal lines which correspond with and are electrically connected with each photosensitive member in a one-to-one manner, and the reference signal lines are arranged in a same layer as the gate of the TFT.

2. The fingerprint recognition device of claim 1, further comprising a shielding layer which is arranged over the insulating layer and covers an active layer of each TFT, wherein the shielding layer and the first electrically conductive connection member are arranged in a same layer and comprise a same material.

3. The fingerprint recognition device of claim 2, wherein the TFTs are arranged in a matrix, and the fingerprint recognition device further comprises:
    scan lines which correspond with each row of the TFTs in a one-to-one manner and are electrically connected with a gate of each TFT in the corresponding row; and
    fingerprint recognition lines which correspond with each column of TFTs in a one-to-one manner and are electrically connected with a source of each TFT in the corresponding column.

4. The fingerprint recognition device of claim 1, further comprising: an insulating protection layer which covers the photosensitive members and the shielding layer, and a second electrically conductive connection member which is arranged over the insulating protection layer and corresponds with each photosensitive member in a one-to-one manner,
    wherein the second electrically conductive connection member is electrically connected with the photosensitive members through second vias which penetrate the insulating protection layer, and the photosensitive members are electrically connected with the reference signal lines through the corresponding second electrically conductive connection member.

5. The fingerprint recognition device of claim 4, wherein both the source and the drain of the TFT are arranged over the active layer, and a gate insulating layer and the gate are arranged in sequence below the active layer, and
    the fingerprint recognition device further comprises a third electrically conductive connection member which is arranged between the reference signal lines and the second electrically conductive connection member, wherein the second electrically conductive connection member is electrically connected with the reference signal lines through the third electrically conductive connection member.

6. The fingerprint recognition device of claim 5, wherein the third electrically conductive connection member and the shielding layer are arranged in a same layer and comprise a same material, the second electrically conductive connection member is electrically connected with the third electrically conductive connection member through third vias which penetrate the insulating protection layer, and the third electrically conductive connection member is electrically connected with the reference signal lines through fourth vias which penetrate the insulating layer and the gate insulating layer.

7. The fingerprint recognition device of claim 5, further comprising an etching barrier layer which is arranged between the active layer and the drain of the TFT,
    wherein the third electrically conductive connection member comprises a first sub-connection member and a second sub-connection member, the first sub-connection member and the shielding layer are arranged in a same layer and comprise a same material, and the second sub-connection member and the drain of the TFT are arranged in a same layer and comprise a same material, and
    wherein the second electrically conductive connection member is electrically connected with the first sub-connection member through third vias which penetrate the insulating protection layer, the first sub-connection member is electrically connected with the second sub-connection member through fifth vias which penetrate the insulating layer, and the second sub-connection member is electrically connected with the reference signal lines through fourth vias which penetrate the etching barrier layer and the gate insulating layer.

8. The fingerprint recognition device of claim 4, further comprising a fourth electrically conductive connection member which is arranged between the second electrically conductive connection member and the photosensitive members, and which is arranged below the insulating protection layer, wherein the second electrically conductive connection member is electrically connected with the photosensitive members through the fourth electrically conductive connection member.

9. The fingerprint recognition device of claim 8, wherein the second electrically conductive connection member and the fourth electrically conductive connection member are made from a transparent electrically conductive oxide.

10. A display device, comprising the fingerprint recognition device claim 1.

11. A method for fabricating a fingerprint recognition device, comprising:
    forming a pattern comprising TFTs on a base plate;

forming a pattern comprising an insulating layer which covers each TFT, wherein the insulating layer is provided with first vias in a region corresponding with a drain of each TFT, and the first vias penetrate the insulating layer;

forming a pattern comprising a first electrically conductive connection member in each of the first vias, wherein the first electrically conductive connection member is electrically connected with a drain of the TFT; and forming a pattern comprising photosensitive members which correspond with each TFT in a one-to-one manner on the insulating layer, wherein the photosensitive members are electrically connected with the drain of corresponding TFT through the first vias, wherein forming the pattern comprising TFTs on the base plate comprises forming a pattern comprising gates and reference signal lines on the base plate, and the reference signal lines correspond with and are electrically connected with each photosensitive member in a one-to-one manner.

12. The method of claim 11, wherein forming the pattern comprising the first electrically conductive connection member comprises:

forming a shielding film on the base plate on which the pattern comprising the insulating layer has been formed; and patterning the shielding film, to forming a pattern comprising a shielding layer in a region where an active layer of each TFT is located and the pattern comprising the first electrically conductive connection member in each of the first vias.

13. The method of claim 12, wherein the TFTs are arranged in a matrix, and the method further comprises:

forming a pattern comprising scan lines which correspond with each row of the TFTs in a one-to-one manner and are electrically connected with a gate of each TFT in the corresponding row, and a pattern comprising fingerprint recognition lines which correspond with each column of TFTs in a one-to-one manner and are electrically connected with a source of each TFT in the corresponding column.

14. The method of claim 13, wherein forming the pattern comprising the TFTs and the pattern comprising the reference signal lines comprise:

forming a gate insulating layer which covers the gate and the reference signal lines;

forming a pattern comprising the active layer which corresponds with each the gate on the gate insulating layer; and forming a pattern comprising the source and the drain on the active layer.

15. The method of claim 14, further comprising:

at a same time as forming the pattern comprising the insulating layer, forming fourth vias which penetrate the insulating layer and the gate insulating layer, wherein each of the fourth vias is arranged a region which corresponds with each of the reference signal lines; and at a same time as patterning the shielding film, forming a pattern comprising a third electrically conductive connection member which corresponds with each of the reference signal lines in a one-to-one manner, wherein the third electrically conductive connection member is electrically connected with the corresponding reference signal line through the fourth vias.

16. The method of claim 15, wherein after forming the pattern comprising the photosensitive members, the method further comprises:

forming an insulating protection layer;

by patterning for one time, forming second vias which penetrate the insulating protection layer in a region corresponding with each photosensitive member, and forming third vias which penetrate the insulating protection layer in a region corresponding with each third electrically conductive connection member; and forming a pattern comprising a second electrically conductive connection member which corresponds with each photosensitive member in a one-to-one manner on the insulating protection layer, wherein the second electrically conductive connection member is electrically connected with the photosensitive members through the second vias, and the second electrically conductive connection member is electrically connected with the third electrically conductive connection member through the third vias.

17. The method of claim 14, wherein after forming the pattern comprising the active layer, and prior to forming the pattern comprising the source and the drain, the method further comprises:

forming an etching barrier layer, and forming fourth vias which penetrate the etching barrier layer and the gate insulating layer;

at a same time as forming the pattern comprising the source and the drain, forming a pattern comprising a second sub-connection member which corresponds with each of the fourth vias in a one-to-one manner, wherein the second sub-connection member is electrically connected with the reference signal lines through the fourth vias;

at a same time as forming the pattern comprising the insulating layer, forming fifth vias which penetrate the insulating layer in a region corresponding with the second sub-connection member; and at a same time as patterning the shielding film, forming a pattern comprising a first sub-connection member which is electrically connected with the second sub-connection member in a one-to-one manner, wherein the first sub-connection member is electrically connected with the second sub-connection member through the fifth vias.

18. The method of claim 17, wherein after forming the pattern comprising photosensitive members, the method further comprises:

forming an insulating protection layer;

by patterning for one time, forming second vias which penetrate the insulating protection layer in a region corresponding with each photosensitive member, and forming third vias which penetrate the insulating protection layer and the insulating layer in a region corresponding with the first sub-connection member; and forming a pattern comprising a second electrically conductive connection member which corresponds with each photosensitive member in a one-to-one manner on the insulating protection layer, wherein the second electrically conductive connection member is electrically connected with the photosensitive members through the second vias, and the second electrically conductive connection member is electrically connected with the first sub-connection member through the third vias.

19. The method of claim 16, wherein after forming the photosensitive member, and prior to forming the second electrically conductive connection member, the method further comprises:
forming a pattern comprising a fourth electrically conductive connection member on the photosensitive members, wherein the fourth electrically conductive connection member is electrically connected with the photosensitive members.

* * * * *